(12) United States Patent
DeHaai et al.

(10) Patent No.: US 9,771,030 B1
(45) Date of Patent: Sep. 26, 2017

(54) MOUNTING SYSTEM FOR ELECTRONIC CONTROL MODULE

(71) Applicant: Caterpillar Inc., Peoria, IL (US)

(72) Inventors: Terry L. DeHaai, Lafayette, IN (US); Matthew A. Trosky, West Lafayette, IN (US); Thomas W. Birch, Lafayette, IN (US); Brett D. Ellen, Peoria Heights, IL (US); Bradley J. Fink, Edelstein, IL (US)

(73) Assignee: Caterpillar Inc., Peoria, IL (US)

( * ) Notice: Subject to any disclaimer, the term of this patent is extended or adjusted under 35 U.S.C. 154(b) by 0 days.

(21) Appl. No.: 15/162,672

(22) Filed: May 24, 2016

(51) Int. Cl.
| | |
|---|---|
| B60R 11/00 | (2006.01) |
| B60K 5/12 | (2006.01) |
| F16F 7/00 | (2006.01) |
| F16F 15/08 | (2006.01) |
| B60R 11/02 | (2006.01) |
| G11B 33/08 | (2006.01) |

(52) U.S. Cl.
CPC ........ B60R 11/0264 (2013.01); B60K 5/1208 (2013.01); B60R 2011/0038 (2013.01); F16F 7/00 (2013.01); F16F 15/08 (2013.01); G11B 33/08 (2013.01)

(58) Field of Classification Search
CPC . B60R 11/00; B60R 2011/0038; F41G 1/393; H02K 5/24; F16F 7/00; F16F 15/08; G11B 33/08
USPC .......... 248/610, 632, 635, 638, 581; 361/679.33; 267/136, 140.3, 141
See application file for complete search history.

(56) References Cited

U.S. PATENT DOCUMENTS

| | | | | | |
|---|---|---|---|---|---|
| 1,526,882 | A | * | 2/1925 | Trimmer | H02K 5/24 248/635 |
| 4,713,714 | A | * | 12/1987 | Gatti | G11B 33/08 248/581 |
| 5,240,222 | A | * | 8/1993 | Seeley | F16F 15/08 248/610 |
| 5,366,200 | A | * | 11/1994 | Scura | F16F 7/00 248/632 |
| 5,564,537 | A | | 10/1996 | Shoureshi | |
| 6,318,329 | B1 | | 11/2001 | Sato | |
| 7,856,916 | B2 | * | 12/2010 | Anderson | F41G 1/393 248/200 |
| 8,432,681 | B2 | * | 4/2013 | Tung-Ke | G11B 33/08 361/679.33 |

FOREIGN PATENT DOCUMENTS

| | | |
|---|---|---|
| CN | 203093952 | 7/2013 |
| DE | 3540670 | 5/1987 |
| WO | 2009097976 | 8/2009 |

* cited by examiner

*Primary Examiner* — Tan Le (57) ABSTRACT

A mounting system for an electronic control module is disclosed. The mounting system includes a first mounting member, a second mounting member, and a third mounting member coupled to the first mounting member and the second mounting member by a plurality of first isolation devices and by a plurality of first fastening members. The third mounting member includes a base portion having a first end and a second end. The base portion is coupled to the ECM by at least one second isolation device and by at least one second fastening member. The third mounting member includes a first leg portion coupled to the first mounting member. The third mounting member further includes a second leg portion coupled to the second mounting member.

4 Claims, 7 Drawing Sheets

MOUNTING SYSTEM FOR ELECTRONIC CONTROL MODULE

TECHNICAL FIELD

The present disclosure relates to a mounting system for an Electronic Control Module.

BACKGROUND

Generally, vehicle components, such as electronic control module (ECM) tend to undergo vibrations during operation of the vehicles, such as off-highway machines. When the vehicle is traversing on an uneven or rough ground surface, the vehicle is subjected to forces that cause an impact on the vehicle components. Due to the impact caused, the vehicle components may tend to get displaced within the vehicle. Therefore, the vehicle components must be securely fastened to the vehicle to prevent any movement. Usually, the vehicle components may be bolted or anchored to a frame of the vehicle to eliminate any movement or vibration. This method of mounting the vehicle components to the frame of the vehicle may result in excessive vibrations caused from the movement of the vehicle. Also, if the vehicle components are attached to a vibration source, such as an engine, then the vehicle components must be securely attached, and must be able to withstand the vibration. Therefore, there may be a need for a secondary mounting system for reducing component vibrations to acceptable levels and hence to withstand the impact caused during movement of the vehicle.

U.S. Pat. No. 6,318,329 (the '329 patent) discloses a direct injected engine including a multi-layer support that attaches injector drivers to the engine while substantially isolating the injector drivers from high and low frequency vibrations. One layer of the support is formed of a relatively hard material so as to dampen high frequency vibrations produced by the engine when running at high speeds. A second layer of the support is formed of a softer material so as to dampen low frequency vibrations produced by another electronic control component, such as, for example, an electronic control unit (ECU), which the support also attaches to the engine. The ECU is disposed between the engine and a housing containing the injector drivers. The first layer of the support in this structure substantially isolates both the electronic control unit and the injector drivers from engine vibrations, and the second layer of the support substantially isolates the injector drivers from ECU-produced vibrations.

SUMMARY OF THE DISCLOSURE

In one aspect of the present disclosure, a mounting system for an Electronic Control Module (ECM) is provided. The mounting system includes a first mounting member and a second mounting member. The mounting system further includes a third mounting member configured to couple to the first mounting member and the second mounting member by a plurality of first isolation devices and by a plurality of first fastening members. The third mounting member includes a base portion having a first end and a second end. The base portion is configured to couple to the ECM by at least one second isolation device and by at least one second fastening member. The third mounting member further includes a first leg portion extending from the first end of the base portion. The first leg portion is configured to couple to the first mounting member by at least one first isolation device of the plurality of first isolation devices and at least one first fastening member of the plurality of first fastening members. The third mounting member further includes a second leg portion extending from the second end of the base portion. The second leg portion is configured to couple to the second mounting member by at least one first isolation device of the plurality of first isolation devices and at least one first fastening member of the plurality of first fastening members.

In another aspect of the present disclosure, a mounting system for an Electronic Control Module (ECM) of an engine is provided. The mounting system includes a first mounting member configured to couple to the engine. The mounting system further includes a second mounting member configured to couple to the engine. The mounting system further includes a third mounting member configured to couple to the first mounting member and the second mounting member. The third mounting member includes a base portion having a first end and a second end. The base portion is configured to couple to the ECM. The third mounting member further includes a first leg portion extending from the first end of the base portion. The first leg portion is configured to couple to the first mounting member by at least one first fastening member. The third mounting member further includes a second leg portion extending from the second end of the base portion. The second leg portion is configured to couple to the second mounting member by at least one first fastening member. The mounting system further includes a plurality of first isolation devices disposed vertically between the first and second leg portions of the third mounting member and the first and second mounting members respectively, to isolate a first frequency region of vibration produced by the engine. The mounting system further includes at least one second isolation device disposed horizontally between the base portion of the third mounting member and the ECM to isolate a second frequency region of the vibration produced by the engine.

In yet another aspect of the present disclosure, a mounting system for an Electronic Control Module (ECM) of an engine is provided. The mounting system includes a first mounting member configured to couple to the engine. The mounting system further includes a second mounting member configured to couple to the engine. The mounting system further includes a third mounting member configured to couple to the first mounting member and the second mounting member. The third mounting member includes a base portion having a first end and a second end. The base portion is configured to couple to the ECM. The third mounting member further includes a first leg portion extending from the first end of the base portion. The first leg portion is configured to couple to the first mounting member by at least one first fastening member. The third mounting member further includes a second leg portion extending from the second end of the base portion. The second leg portion is configured to couple to the second mounting member by at least one first fastening member. The mounting system further includes a plurality of first isolation devices disposed vertically between the first and second leg portions of the third mounting member and the first and second mounting members respectively, to isolate a first frequency region of vibration produced by the engine. The at least one first isolation device includes a first clamping member having a head portion and a shank portion extending from the head portion. The first clamping member includes a first bore extending through the head portion and the shank portion. The first clamping member is configured to receive the at least one fastening member therethrough. The at least one first isolation device further includes a second clamping member having a second bore. The second bore is configured to receive the shank portion of the first clamping member therethrough. The mounting system further includes at least one second isolation device disposed horizontally between the base portion of the third mounting member and the ECM to isolate a second frequency region of the vibration produced by the engine. The at least one second isolation device includes a head portion and a shank portion extending from the head portion. The at least one second isolation device further includes a through bore extending through the head portion and the shank portion. The through bore is configured to receive the at least one second fastening member therethrough.

Other features and aspects of this disclosure will be apparent from the following description and the accompanying drawings.

DETAILED DESCRIPTION

Reference will now be made in detail to specific embodiments or features, examples of which are illustrated in the accompanying drawings. Wherever possible, corresponding or similar reference numbers will be used throughout the drawings to refer to the same or corresponding parts.

Figure 1:
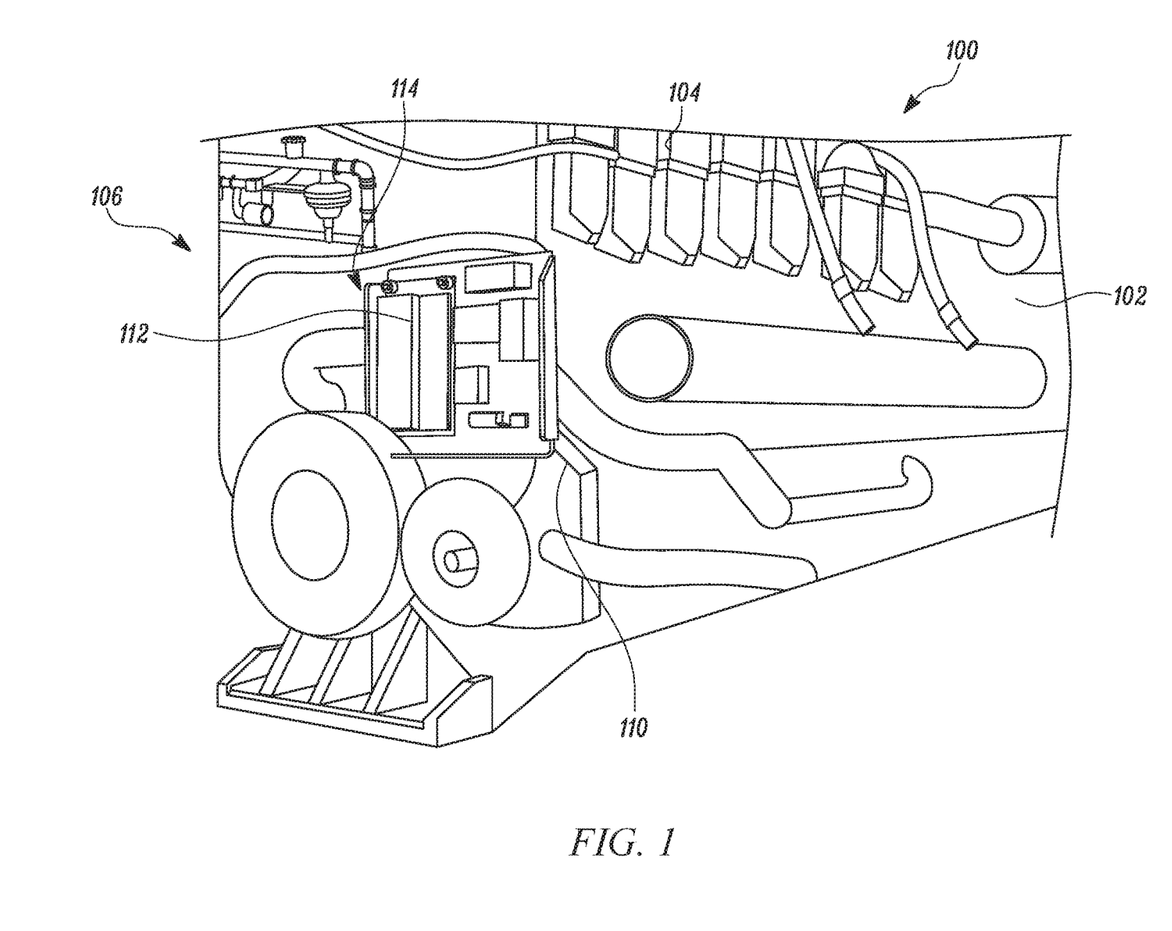
FIG. 1 is a perspective view of an engine having an Electronic Control Module (ECM) mounted thereon by a mounting system, according to an embodiment of the present disclosure.

FIG. 1 illustrates a perspective view of an exemplary engine 100. The engine 100 includes a cylinder block 102 and a cylinder head 104 mounted on the cylinder block 102. The cylinder block 102 has a first end 106 and a second end (not shown) distal to the first end 106. The engine 100 includes a housing 110 coupled to the cylinder block 102. The housing 110 may be configured to enclose various components including, but not limited to, gear drives used for transferring rotational power from a crankshaft to a camshaft, a water pump and an alternator of the engine 100. Flywheel (not shown) of the engine 100 may be disposed at the second end of the cylinder block 102. The engine 100 further includes an Electronic Control Module (ECM) 112 mounted thereon for controlling various operating parameters of the engine 100. In the illustrated embodiment, the ECM 112 is mounted on the housing 110 of the engine 100. In other embodiments, the ECM 112 may be mounted at any location in the cylinder block 102. The ECM 112 is mounted on the engine 100 by a mounting system 114, according to an embodiment of the present disclosure.

Figure 2:
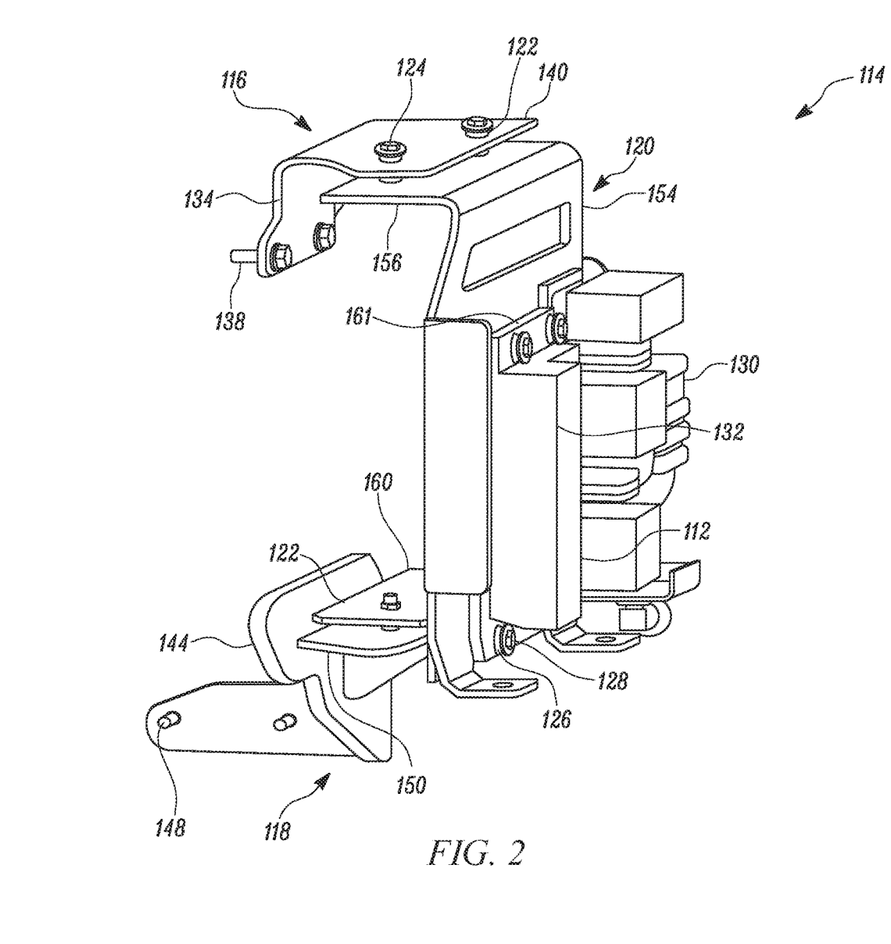
FIG. 2 is a perspective view of the mounting system and the ECM mounted thereon, according to an embodiment of the present disclosure.

FIG. 2 illustrates a perspective view of the mounting system 114 and the ECM 112 mounted thereon, according to an embodiment of the present disclosure. The mounting system 114 includes a first mounting member 116 coupled to the engine 100. Specifically, the first mounting member 116 is formed so as to couple with the housing 110 of the engine 100. In one embodiment, the first mounting member 116 may be made from a metal plate. In another embodiment, the first mounting member 116 may be made from materials, such as plastic, composite material, and polymers. The mounting system 114 further includes a second mounting member 118 coupled to the engine 100. Specifically, the second mounting member 118 is formed so as to couple with the housing 110 of the engine 100 and disposed below the first mounting member 116. In one embodiment, the second mounting member 118 may be made from a metal plate. In another embodiment, the second mounting member 118 may be made from materials, such as plastic, composite material, and polymers. The engine 100 further includes a third mounting member 120 coupled to the first mounting member 116 and the second mounting member 118 by a plurality of first isolation devices 122 and by a plurality of first fastening members 124.

In the illustrated embodiment, the first mounting member 116 and the second mounting member 118 are coupled to the housing 110 of the engine 100 in the form of a cantilever support, such that the third mounting member 120 is horizontally disposed with respect to the housing 110 of the engine 100. Further, the third mounting member 120 may be disposed parallel to the housing 110 of the engine 100. In some embodiments, the third mounting member 120 may be disposed at an angle with respect to the housing 110. The third mounting member 120 may be made from a metal plate. In some embodiments, the third mounting member 120 may be made from materials, such as plastic, composite material, and polymers. A size, a shape and design specifications of each of the first mounting member 116, the second mounting member 118 and the third mounting member 120 are defined based on various characteristic parameters of the engine 100 including, but not limited to, a size of the engine 100, a type of the engine 100, and an application of the engine 100. Further, the size, the shape and the design specifications of each of the first mounting member 116, the second mounting member 118 and the third mounting member 120 are defined to accommodate various accessory components, such as fluid conduits (not shown) disposed around the cylinder block 102 of the engine 100. It may also be understood that disposition of the mounting system 114 in the engine 100 may be varied to accommodate the various accessory components without disturbing them.

The ECM 112 is coupled to the third mounting member 120 by a plurality of second isolation devices 126 and by a plurality of second fastening members 128. The third mounting member 120 is also coupled to a wiring harness 130 associated with the ECM 112. In an example, the wiring harness 130 may be configured to communicate the ECM 112 with multiple sensors (not shown) disposed in the engine 100 to receive signals, indicative of various operating parameters of the engine 100, generated by the multiple sensors. Further, the wiring harness 130 may be configured to communicate the ECM 112 with various systems, such as a fuel supply system, a fuel ignition system, an intake air system, an exhaust system, and a valve system of the engine 100 to control the various operating parameters of the engine 100. In the illustrated embodiment, the ECM 112 includes an outer cover 132 for enclosing various electric and electronic components therein. The various electric and electronic components may be coupled or disposed within the outer cover 132 by a known fastening mechanism. One end of the wiring harness 130 may be coupled to the outer cover 132 of the ECM 112 to communicate with the various electric and electronic components and another end of the wiring harness 130 may be disposed in the third mounting member 120. Multiple receptacles (not shown) may be formed in the third mounting member 120 to further couple the wiring harness 130 with external electric devices disposed in the engine 100.

Figure 3:
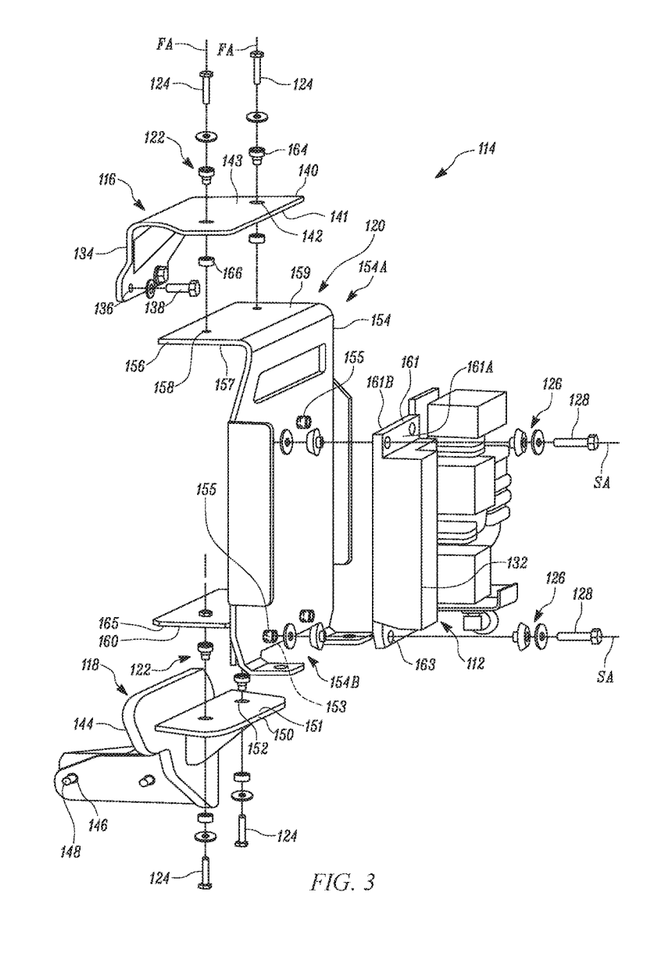
FIG. 3 is an exploded view of the mounting system of FIG. 2, according to an embodiment of the present disclosure.

FIG. 3 illustrates an exploded view of the mounting system 114 of FIG. 2, according to an embodiment of the present disclosure. The first mounting member 116 includes a first flange portion 134 coupled to the housing 110 of the engine 100. The first flange portion 134 includes a pair of through holes 136. Each of the pair of through holes 136 is configured to receive a third fastening member 138 therethrough. The housing 110 of the engine 100 may also include a pair of holes (not shown) corresponding to the pair of through holes 136 in the first flange portion 134. Each of the pair of holes in the housing 110 may threadingly engage with the third fastening member 138. As such, the third fastening members 138 are configured to couple the first flange portion 134 of the first mounting member 116 with the housing 110 of the engine 100. During assembly of the first mounting member 116 with the engine 100, each of the pair of through holes 136 in the first flange portion 134 may be aligned with each of the pair of holes in the housing 110. Further, the third fastening member 138 is inserted through each of the pair of through holes 136 of the first flange portion 134 and each of the holes of the housing 110. The third fastening member 138 may be further tightened to couple the first mounting member 116 to the engine 100. Although the first flange portion 134 of the first mounting member 116 is coupled to the engine 100 as described above, it may be understood that any known fastening mechanism may be implemented to couple the first mounting member 116 with the engine 100 without limiting scope of the present disclosure.

The first mounting member 116 further includes a second flange portion 140 extending from the first flange portion 134. In the illustrated embodiment, the first flange portion 134 and the second flange portion 140 is formed by bending the metal plate. In an alternative embodiment, the first flange portion 134 and the second flange portion 140 may be individual components, which may be welded or fastened with each other. The second flange portion 140 is extending from the first flange portion 134 in such a way that when the first flange portion 134 is coupled to the housing 110 of the engine 100, the second flange portion 140 is disposed perpendicular to a surface (not shown) of the housing 110. The second flange portion 140 includes a pair of first through holes 142. Each of the pair of first through holes 142 is configured to receive each of the plurality of first isolation devices 122 and each of the plurality of first fastening members 124 therethrough.

The second mounting member 118 includes a first flange portion 144 coupled to the housing 110 of the engine 100. The first flange portion 144 includes a pair of through holes 146. Each of the pair of through holes 146 is configured to receive a fourth fastening member 148 therethrough. The housing 110 of the engine 100 may also include a pair of holes (not shown) corresponding to the pair of first through holes 146 in the first flange portion 144. Each of the pair of holes (not shown) may threadingly engage with the fourth fastening member 148. As such, the fourth fastening members 148 are configured to couple the first flange portion 144 of the second mounting member 118 with the housing 110 of the engine 100. During assembly of the second mounting member 118 with the engine 100, each of the pair of through holes 146 in the first flange portion 144 is aligned with each of the pair of holes in the housing 110. Further, the fourth fastening member 148 is inserted through each of the pair of through holes 146 of the first flange portion 144 and each of the pair of holes of the housing 110. The fourth fastening members 148 may be further tightened to couple the second mounting member 118 to the engine 100. Although the first flange portion 144 of the second mounting member 118 is coupled to the engine 100 as described above, it may be understood that any known fastening mechanism may be implemented to couple the second mounting member 118 with the engine 100 without limiting scope of the present disclosure.

The second mounting member 118 further includes a second flange portion 150 extending from the first flange portion 144. In the illustrated embodiment, the first flange portion 144 and the second flange portion 150 are individual components, which are welded with each other. In an alternative embodiment, the first flange portion 144 and the second flange portion 150 may be formed by bending the metal plate. The second flange portion 150 is extending from the first flange portion 144 in such a way that when the first flange portion 144 is coupled to the housing 110 of the engine 100, the second flange portion 150 is disposed perpendicular to the surface of the housing 110. The second flange portion 150 includes a pair of second through holes 152. Each of the pair of second through holes 152 is configured to receive each of the plurality of first isolation devices 122 and each of the plurality of first fastening members 124 therethrough.

The third mounting member 120 includes a base portion 154 having a first end 154A and a second end 154B. The base portion 154 is coupled to the ECM 112 via the plurality of second isolation devices 126 and the plurality of second fastening members 128. In the illustrated embodiment, the base portion 154 is rectangular in shape having a size greater than a rectangular shape of the outer cover 132 of the ECM 112. In various embodiments, the base portion 154 may have a square shape, a circular shape, a polygonal shape or any other shape known in the art to couple with the ECM 112 having any shape. In the illustrated embodiment, the base portion 154 includes a plurality of holes 153 configured to receive the plurality of second fastening members 128 therethrough. Further, each of the plurality of holes 153 is associated with a spacer 155. The spacer 155 is coupled to each of the plurality of holes 153 in such a way that the second fastening member 128 is received through the spacer 155 and then to the hole 153. In one example, the second fastening member 128 may threadingly engage with the hole 153 provided in the base portion 154. In another example, the second fastening member 128 may threadingly engage with the spacer 155. In the illustrated embodiment, the spacer 155 is welded to the base portion 154 to align with the hole 153. In some embodiments, the spacer 155 may be coupled to the base portion 154 by any fastening method known in the art. The spacer 155 may have a length defined based on various parameters including, but not limited to, a distance at which the ECM 112 to be disposed with respect to the base portion 154. In an alternative embodiment, the spacer 155 may be an individual component that may be aligned with the hole 153 during assembly of the ECM 112 with the third mounting member 120.

The third mounting member 120 further includes a first leg portion 156 extending from the first end 154A of the base portion 154. The first leg portion 156 is configured to couple to the first mounting member 116 by a pair of the plurality of first fastening members 124. It may be understood that at least one of the plurality of first fastening members 124 may be used for coupling the first leg portion 156 with the first mounting member 116. In the illustrated embodiment, the first leg portion 156 and the base portion 154 are formed by bending the metal plate. In an alternative embodiment, the first leg portion 156 and the base portion 154 may be individual components, which may be welded or fastened with each other. The first leg portion 156 includes a pair of third through holes 158. Each of the pair of third through holes 158 is configured to receive each of the plurality of first fastening members 124 therethrough.

The third mounting member 120 further includes a second leg portion 160 extending from the second end 154B of the base portion 154. The second leg portion 160 is configured to couple to the second mounting member 118 by a pair of the plurality of first fastening members 124. In the illustrated embodiment, the second leg portion 160 is an individual component welded to the base portion 154. Alternatively, the second leg portion 160 may be bolted to the base portion 154. In some embodiments, the second leg portion 160 may be integrally formed with the base portion 154 by bending the metal plate. The second leg portion 160 includes a pair of fourth through holes 162. Each of the pair of fourth through holes 162 is configured to receive each of the plurality of first fastening members 124 therethrough. The first leg portion 156 and the second leg portion 160 are extending from the base portion 154 in such a way that when the third mounting member 120 is coupled to the first and second mounting members 116, 118, the base portion 154 of the third mounting member 120 is disposed parallel to the surface of the housing 110 in the vertical direction.

The outer cover 132 of the ECM 112 includes an annular flange 161 for coupling the ECM 112 with the third mounting member 120. The annular flange 161 includes a plurality of holes 163 to receive the plurality of second fastening members 128. However, it may be understood that at least one hole may be provided in the annular flange 161 to couple the ECM 112 with the third mounting member 120 via one of the plurality of second fastening members 128.

Figure 4:
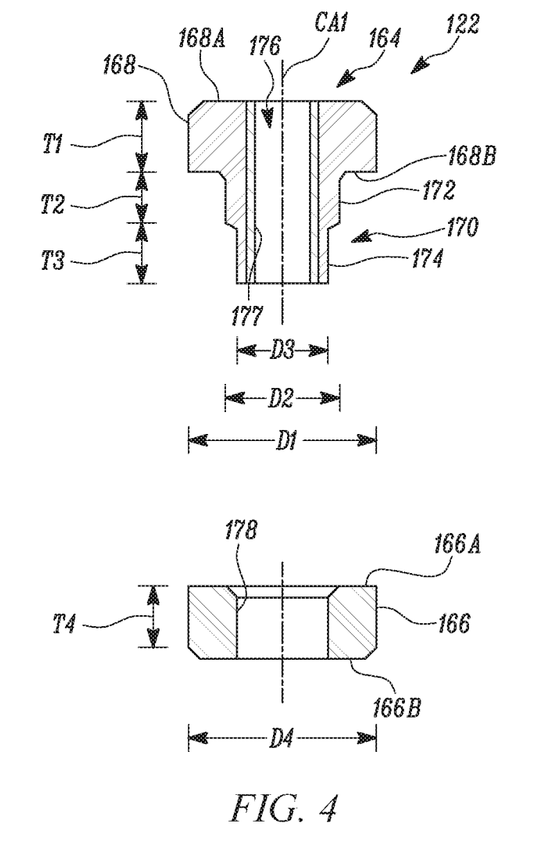
FIG. 4 is a sectional view of a first isolation device of the mounting system, according to an embodiment of the present disclosure.

FIG. 4 illustrates a sectional view of one of the plurality of first isolation devices 122 used for coupling the first mounting member 116 with the first leg portion 156 of the third mounting member 120, according to an embodiment of the present disclosure. The first isolation device 122 includes a first clamping member 164 and a second clamping member 166. In the illustrated embodiment, the first clamping member 164 includes a head portion 168 and a shank portion 170 extending from the head portion 168. The head portion 168 has a circular cross section having a diameter 'D1'. In other embodiments, the cross section of the head portion 168 may be a square, a polygon, or any other shape known in the art. The head portion 168 further includes a first surface 168A and a second surface 168B defining a thickness 'T1'. The diameter 'D1' and the thickness 'T1' define an original shape of the head portion 168 of the first clamping member 164. The shank portion 170 extends along a central axis 'CA1' of the head portion 168.

The shank portion 170 includes a first step portion 172 defined adjacent to the head portion 168. The first step portion 172 is configured to receive through the third through hole 158 of the first leg portion 156 of the third mounting member 120. A diameter 'D2' of the first step portion 172 may be equal to or greater than a diameter (not shown) of the third through hole 158 of the first leg portion 156 of the third mounting member 120. The first step portion 172 may have a thickness 'T2' equal to or greater than a thickness (not shown) of the first leg portion 156 of the third mounting member 120. The shank portion 170 further includes a second step portion 174 extending from the first step portion 172. The second step portion 174 is configured to engage with the second clamping member 166. A diameter 'D3' of the second step portion 174 may be equal to or less than the diameter 'D2' of the first step portion 172. The second step portion 174 has a thickness 'T3'. The first clamping member 164 further includes a first bore 176 extending through the head portion 168 and the shank portion 170. The first bore 176 is configured to receive the first fastening member 124 therethrough. In one embodiment, the first bore 176 includes a first spacer 177 made from a metal. The first spacer 177 is integrally formed with the first clamping member 164, and configured to receive the first fastening member 124 therethrough. In another embodiment, the first spacer 177 may be an individual component that may be received within the first bore 176 during assembly of the mounting system 114 with the engine 100.

The second clamping member 166 has a circular cross section having a diameter 'D4'. In other embodiments, the cross section of the second clamping member 166 may be a square, a polygon, or any other shape known in the art. The second clamping member 166 further includes a first surface 166A and a second surface 166B defining a thickness 'T4'. The thickness 'T4' of the second clamping member 166 is equal to or greater than the thickness 'T3' of the second step portion 174 of the shank portion 170. The second clamping member 166 further includes a second bore 178 configured to receive the first fastening member 124 therethrough.

Figure 5:
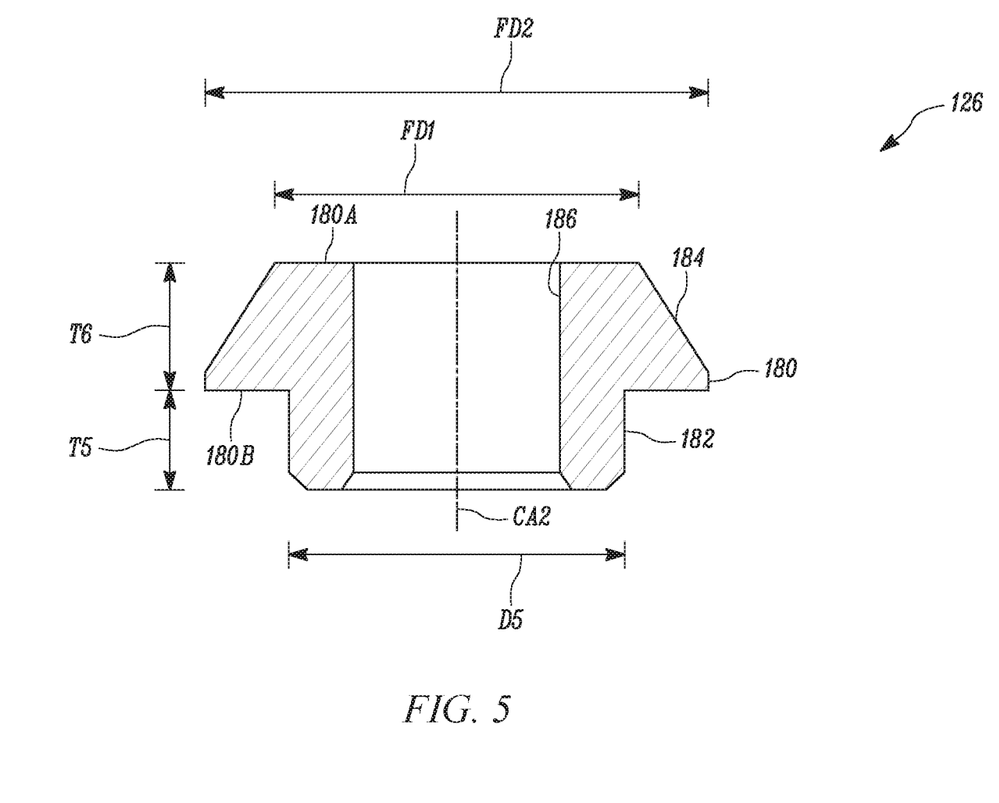
FIG. 5 is a sectional view of a second isolation device of the mounting system, according to an embodiment of the present disclosure.

FIG. 5 illustrates a sectional view of the second isolation device 126 used for coupling the ECM 112 with the base portion 154 of the third mounting member 120, according to an embodiment of the present disclosure. In an assembly, a pair of the second isolation devices 126 is used in conjunction with each other to couple the ECM 112 with the third mounting member 120 via each of the plurality of second fastening members 128. For the purpose of illustration, one of the pair of second isolation devices 126 is shown in FIG. 2.

In the illustrated embodiment, the second isolation device 126 includes a head portion 180 and a shank portion 182 extending from the head portion 180. The head portion 180 has a circular cross section. In other embodiments, the cross section of the head portion 180 may be a square, a polygon, or any other shape known in the art. The head portion 180 further includes a first surface 180A and a second surface 180B defining a thickness 'T6'. At the first surface 180A, the head portion 180 has a first diameter 'FD1' and, at the second surface 180B, the head portion 180 has a second diameter 'FD2' greater than the first diameter 'FD2', thus defining a tapered portion 184. The first diameter 'FD1', the second diameter 'FD2', the tapered portion 184, and the thickness 'T6' define an original shape of the head portion 180 of the second isolation device 126. The shank portion 182 is extending along a central axis 'CA2' of the head portion 180. The shank portion 182 of the second isolation device 126 has a diameter 'D5' less than the second diameter 'FD2' of the head portion 180 and configured to receive through the hole 163 defined in the annular flange 161 of the outer cover 132 of the ECM 112. The shank portion 182 may have a thickness 'T5' equal to or less than a thickness of the annular flange 161 of the outer cover 132 of the ECM 112. The second isolation device 126 further includes a through bore 186 extending through the head portion 180 and the shank portion 182. The through bore 186 is configured to receive the second fastening member 128 therethrough.

The plurality of first isolation devices 122 is configured to isolate a first frequency region of the vibration produced by the engine 100. In one example, the first frequency region is above 80 Hz of the vibration. In various examples, the first frequency region may be a desired mid frequency range of the vibration that is to be attenuated to prevent premature failure of the mounting system 114. Similarly, the plurality of second isolation devices 126 is configured to isolate a second, higher frequency region of the vibration produced by the engine 100. In one example, the second frequency region is above 500 Hz of the vibration.

Figure 6:
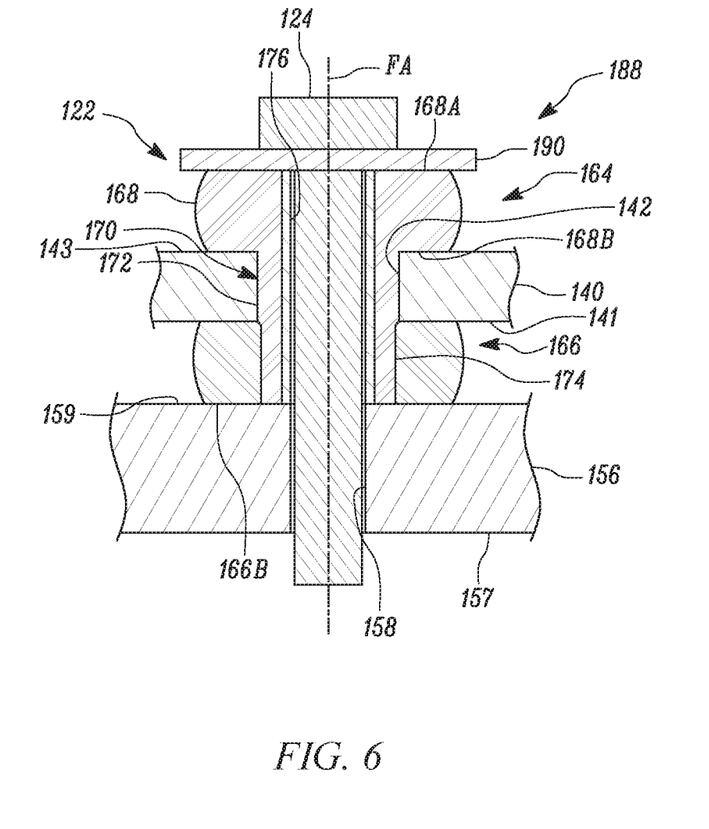
FIG. 6 is a partial sectional view of an assembly of the first isolation device of FIG. 4, according to an embodiment of the present disclosure.

FIG. 6 illustrates a partial sectional view of an assembly 188 of the first isolation device 122 with the first leg portion 156 of the third mounting member 120 and the first mounting member 116, according to an embodiment of the present disclosure. The first isolation device 122 is vertically disposed between an inner surface 141 of the second flange portion 140 of the first mounting member 116 and an outer surface 159 of the first leg portion 156 of the third mounting member 120. More specifically, the first isolation device 122 is disposed vertically along a first axis 'FA' defined by the first fastening member 124. Similarly, the first isolation device 122 is vertically disposed between an inner surface 151 (shown in FIG. 3) of the second flange portion 150 of the second mounting member 118 and an outer surface 165 (shown in FIG. 3) of the second leg portion 160 of the third mounting member 120. The assembly 188 includes the first isolation device 122, the first fastening member 124 and a washer 190. In one embodiment, the first clamping member 164 is inserted through the first through hole 142 of the second flange portion 140 of the first mounting member 116, such that the first step portion 172 of the shank portion 170 is received within the first through hole 142. Further, the second surface 168B of the head portion 168 abuts an outer surface 143 of the second flange portion 140. The second clamping member 166 is further inserted over the second step portion 174 of the shank portion 170 of the first clamping member 164. The washer 190 is further disposed on the first surface 168A of the head portion 168 of the first clamping member 164. The washer 190 has a diameter greater than the diameter 'D1' of the head portion 168 of the first clamping member 164. The washer 190 is configured to provide uniform distribution of load on the first isolation device 122 when torque is applied on the first fastening member 124. The third through hole 158 of the first leg portion 156 of the third mounting member 120 is aligned with the first bore 176 of the first clamping member 164.

The first fastening member 124 is further inserted through the first bore 176 of the first clamping member 164 and the third through hole 158 of the first leg portion 156. In one example, the first fastening member 124 may threadingly engage with the third through hole 158 provided in the first leg portion 156. In another example, the first fastening member 124 may pass through the third through hole 158 and a nut (not shown) may be disposed adjacent to an inner surface 157 of the first leg portion 156 to engage with the first fastening member 124. As the first fastening member 124 is tightened by applying a torque on a head of the first fastening member 124, the head portion 168 of the first clamping member 164 and the second clamping member 166 deflect from the original shape thereof radially outward due to the load applied on the first fastening member 124. In another embodiment, the first clamping member 164 may be inserted through the third through hole 158 of the first leg portion 156 such that the first step portion 172 of the shank portion 170 may be received within the third through hole 158 of the first leg portion 156. In the illustrated embodiment, a pair of such assemblies 188 is provided between the first mounting member 116 and the first leg portion 156 of the third mounting member 120. Similarly, a pair of such assemblies 188 is provided between the second mounting member 118 and the second leg portion 160 of the third mounting member 120. Thus, the third mounting member 120 is coupled to the first and second mounting members 116, 118 respectively by the plurality of first isolation devices 122 and the plurality of first fastening members 124 to isolate the desired mid frequency range of the vibration produced by the engine 100.

Figure 7:
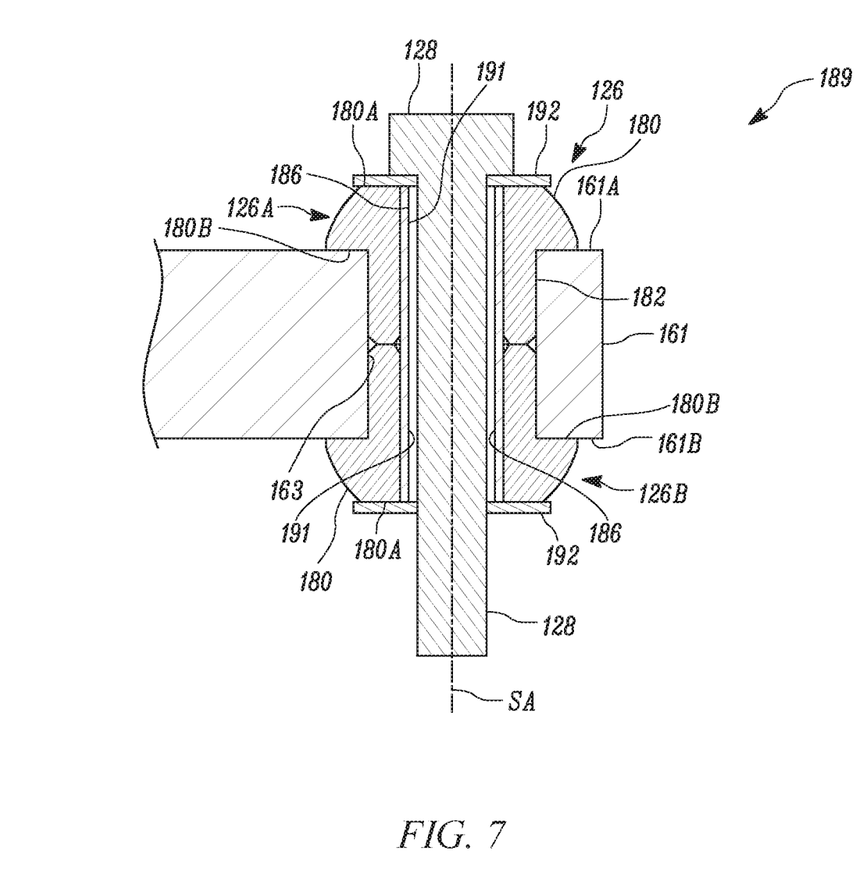
FIG. 7 is a partial sectional view of an assembly of the second isolation device of FIG. 5, according to an embodiment of the present disclosure.

FIG. 7 illustrates a partial sectional view of an assembly 189 of the pair of the second isolation devices 126 with the annular flange 161 of the ECM 112 and the base portion 154 of the third mounting member 120, according to an embodiment of the present disclosure. The plurality of second isolation devices 126 is horizontally disposed between the base portion 154 of the third mounting member 120 and the ECM 112. More specifically, each of the plurality of second isolation devices 126 is disposed horizontally along a second axis 'SA' defined by the second fastening member 128. For illustration purpose, a second isolation device 126A and a second isolation device 126B are shown in the FIG. 7. The assembly 189 includes the second isolation devices 126A and 126B, a second spacer 191, and a pair of washers 192. In the illustrated embodiment, the second isolation device 126A is disposed adjacent to an outer surface 161A of the annular flange 161 of the outer cover 132 and the shank portion 182 is inserted through the hole 163 provided in the annular flange 161. As such, the second surface 180B of the head portion 180 of the second isolation device 126A abuts the outer surface 161A of the annular flange 161.

The second isolation device 126B is disposed adjacent to an inner surface 161B of the annular flange 161 of the outer cover 132 and the shank portion 182 is inserted through the hole 163 provided in the annular flange 161. As such, the second surface 180B of the head portion 180 of the second isolation device 126B abuts the inner surface 161B of the annular flange 161. The second spacer 191 is further inserted through the through bores 186 of the second isolation devices 126A and 126B, such that inner surfaces of the through bores 186 of the second isolation devices 126A and 126B may abut an outer surface of the second spacer 191. Further, each of the pair of washers 192 is disposed on the first surface 180A of the head portion 180 of each of the second isolation devices 126A and 126B. Each of the pair of washers 192 has a diameter greater than the first diameter 'FD1' of the head portion 180 of each of the second isolation devices 126A and 126B. The pair of washers 192 is configured to provide uniform distribution of load on the second isolation devices 126A and 126B when torque is applied on the second fastening member 128. The second fastening member 128 is further inserted through the through bore 186 of the second isolation devices 126A and 126B, the hole 163 of the annular flange 161, the spacer 155 and the hole 153 provided in the base portion 154 of the third mounting member 120. In one example, the second fastening member 128 may threadingly engage with the hole 153 and the spacer 155 provided in the base portion 154. In another example, the second fastening member 128 may pass through the hole 153 and the spacer 155, and a nut (not shown) may be disposed adjacent to the base portion 154 to engage with the second fastening member 128. As the second fastening member 128 is tightened by applying a torque on a head of the second fastening member 128, the head portion 180 of the second isolation devices 126A and 126B deflect from the original shape thereof radially outward due to the load applied on the second fastening member 128. In the illustrated embodiment, four such assemblies 189 are provided between the third mounting member 120 and the ECM 112. Thus, the third mounting member 120 is coupled to the ECM 112 by the plurality of second isolation devices 126 and the plurality of second fastening members 128 to isolate the desired high frequency range of the vibration produced by the engine 100.

INDUSTRIAL APPLICABILITY

The present disclosure relates to the mounting system 114 having the first mounting member 116, the second mounting member 118 and the third mounting member 120. The first mounting member 116 and the second mounting member 118 are coupled with the first leg portion 156 and the second leg portion 160, respectively, of the third mounting member 120 via the first isolation devices 122. The first isolation devices 122 are configured to isolate the desired mid frequency region above 80 Hz of the vibration produced by the engine 100. More specifically, the first isolation devices 122 may be used for isolating some other defined mid frequency range of the vibration that is to be attenuated to prevent premature failure of the mounting system 114. Further, the first isolation devices 122 may be tuned to filter out mid vibration frequencies to allow use of stiffer second isolation devices 126, and thereby to improve durability of the second isolation devices 126, while adequately isolating damaging high frequency region of the vibration to the ECM 112. The first isolation devices 122 may also be tuned to filter out damaging mid and high frequency region of the vibration transferred to the third mounting member 120 and other components associated with the third mounting member 120 for improving durability thereof. Various dimensional specifications of the first clamping member 164, such as the diameter 'D1' and the thickness 'T1' of the head portion 168, the diameter 'D2' and the thickness 'T2' of the first step portion 172 of the shank portion 170, the diameter 'D3' and the thickness 'T3' of the second step portion 174 of the shank portion 170, and the diameter 'D4' and the thickness 'T4' of the second clamping member 166 may be defined to isolate desired mid frequency range of the vibration produced by the engine 100. Further, chamfer portion and/or fillet portion defined between the head portion 168 and the shank portion 170 may be defined to isolate desired mid frequency range of the vibration produced by the engine 100. Further, the first isolation devices 122 are made from polymer material, such as rubber to isolate the desired mid frequency range of the vibration.

The ECM 112 is coupled to the third mounting member 120 via the second isolation device 126. The second isolation devices 126 are configured to isolate desired high frequency region above 500 Hz of the vibration produced by the engine 100. More specifically, the second isolation devices 126 may be used for isolating some other defined high frequency range of the vibration that is to be attenuated to prevent premature failure of the mounting system 114. Various dimensional specifications of the second isolation devices 126, such as the first and second diameters 'FD1', 'FD2' and the thickness 'T6' of the head portion 180, and the diameter 'D5' and the thickness 'T5' of the shank portion 182 may be defined to isolate the desired high frequency range of the vibration produced by the engine 100. Further, chamfer portion and/or fillet portion defined between the head portion 180 and the shank portion 182 may be defined to isolate the desired high frequency range of the vibration. Further, the second isolation devices 126 are made from polymer material, such as rubber to isolate the high frequency range of the vibration.

Thus, a series of isolation systems including the plurality of first isolation devices 122 and the plurality of second isolation devices 126 is provided in the mounting system 114 to isolate the desired mid frequency region and the desired high frequency region of the vibration. Further, the plurality of first isolation devices 122 and the plurality of second isolation devices 126 together provide better isolation of high frequency region vibration and hence improve the durability of the supported ECM 112. Also, C shape structure of the mounting system 114 defined by the first mounting member 116, the second mounting member 118 and the third mounting member 120 is tuned to reduce the vibration. Further, the plurality of first isolation devices 122 is disposed vertically between the third mounting member 120 and the first and second mounting members 116, 118, and the plurality of second isolation devices 126 is disposed horizontally between the third mounting member 120 and the ECM 112 to isolate the desired frequency range of the vibration. In such dual isolation system including the plurality of first isolation devices 122 and the plurality of second isolation devices 126, isolation of a certain high frequency region of the vibration may still be achieved even if either of the first isolation device 122 or the second isolation device 126 fails to function as desired. The mounting system 114 also provides sufficient damping at natural frequencies to control vibration response to acceptable levels.

While aspects of the present disclosure have been particularly shown and described with reference to the embodiments above, it will be understood by those skilled in the art that various additional embodiments may be contemplated by the modification of the disclosed machines, systems and methods without departing from the spirit and scope of what is disclosed. Such embodiments should be understood to fall within the scope of the present disclosure as determined based upon the claims and any equivalents thereof.

What is claimed is:

1. A mounting system for an Electronic Control Module (ECM) of an engine, the mounting system comprising:
   a first mounting member configured to couple to the engine;
   a second mounting member configured to couple to the engine;
   a third mounting member configured to couple to the first mounting member and the second mounting member, the third mounting member comprising:
      a base portion having a first end and a second end, the base portion configured to couple to the ECM;
      a first leg portion extending from the first end of the base portion, and configured to couple to the first mounting member by at least one first fastening member; and
      a second leg portion extending from the second end of the base portion, and configured to couple to the second mounting member by at least one first fastening member;
   at least one first isolation device disposed vertically between the first and second leg portions of the third mounting member and the first and second mounting members respectively, to isolate a first frequency region of vibration produced by the engine, the at least one first isolation device comprising:
  a first clamping member having a head portion and a shank portion extending from the head portion, the first clamping member comprises a first bore extending through the head portion and the shank portion, and configured to receive the at least one fastening member therethrough; and
  a second clamping member having a second bore, the second bore configured to receive the shank portion of the first clamping member therethrough; and
at least one second isolation device disposed horizontally between the base portion of the third mounting member and the ECM to isolate a second frequency region of the vibration produced by the engine, the at least one second isolation device comprising:
  a head portion;
  a shank portion extending from the head portion; and
  a through bore extending through the head portion and the shank portion, and configured to receive the at least one second fastening member therethrough.

2. The mounting system of claim 1, wherein the at least one first isolation device is configured to isolate the first frequency region above 80 Hz of the vibration.

3. The mounting system of claim 1, wherein the at least one second isolation device is configured to isolate the second frequency region above 500 Hz of the vibration.

4. The mounting system of claim 1, wherein the at least one first isolation device and the at least one second isolation device are made from a polymer.

* * * * *